(12) United States Patent
Barnett et al.

(10) Patent No.: US 9,917,242 B2
(45) Date of Patent: Mar. 13, 2018

(54) THERMOPILE TEMPERATURE SENSOR FIELD OF VIEW NARROWING USING INTEGRATED LIGHT BLOCKING LAYER AND LENS

(71) Applicant: Maxim Integrated Products, Inc., San Jose, CA (US)

(72) Inventors: Stanley Barnett, San Francisco, CA (US); Cheng-Wei Pei, Belmont, CA (US); Arvin Emadi, San Jose, CA (US); Jerome C. Bhat, Palo Alto, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 144 days.

(21) Appl. No.: 14/865,593

(22) Filed: Sep. 25, 2015

(65) Prior Publication Data
US 2016/0282194 A1 Sep. 29, 2016

Related U.S. Application Data

(60) Provisional application No. 62/139,091, filed on Mar. 27, 2015.

(51) Int. Cl.
*G01R 27/08* (2006.01)
*H01L 35/34* (2006.01)
(Continued)

(52) U.S. Cl.
CPC ............... *H01L 35/34* (2013.01); *G01J 5/04* (2013.01); *H01L 35/32* (2013.01)

(58) Field of Classification Search
CPC ....................................................... H01L 21/00
(Continued)

(56) References Cited

U.S. PATENT DOCUMENTS 6,031,231 A * 2/2000 Kimata .................... G01J 5/08
250/332
8,586,395 B2 * 11/2013 Meinel ...................... G01J 5/12
257/E29.347
(Continued)

FOREIGN PATENT DOCUMENTS

CN 100402984 C 7/2008
CN 102128685 A 7/2011
(Continued)

OTHER PUBLICATIONS

Office Action dated Jul. 24, 2017 for Chinese Appln. No. 2016103461598.

*Primary Examiner* — Nina Bhat
(74) *Attorney, Agent, or Firm* — Advent, LLP (57) ABSTRACT

A sensor device, a sensor package, and method for fabricating a sensor device are described that include an integrated light blocker disposed on the thermopile device and a lens configured to direct light to the thermopile device. In an implementation, the thermopile device includes a substrate; a thermopile membrane disposed on the substrate, the thermopile membrane including at least one passivation layer; a thermopile disposed within the thermopile membrane, the thermopile including at least one thermocouple; and a light blocking layer disposed proximate to the thermopile membrane, the light blocking layer including an aperture disposed proximate to the thermopile.

17 Claims, 9 Drawing Sheets

(51) Int. Cl.
*H01L 35/32* (2006.01)
*G01J 5/04* (2006.01)

(58) Field of Classification Search
USPC .......... 374/179; 324/703; 250/332; 257/467, 257/436
See application file for complete search history.

(56) References Cited

U.S. PATENT DOCUMENTS

| | | | |
|---|---|---|---|
| 9,412,927 B2* | 8/2016 | Emadi ....................... | G01J 5/12 |
| 2004/0031924 A1 | 2/2004 | Cho et al. | |
| 2004/0113076 A1* | 6/2004 | Guo ....................... | G01H 11/08 |
| | | | 250/338.1 |
| 2010/0327393 A1* | 12/2010 | Meinel ................ | B81C 1/00047 |
| | | | 257/467 |
| 2011/0147869 A1* | 6/2011 | Lazarov ................... | G01J 5/02 |
| | | | 257/432 |
| 2012/0061569 A1* | 3/2012 | Noguchi ................. | G01J 5/024 |
| | | | 250/338.3 |
| 2012/0097853 A1* | 4/2012 | Ouvrier-Buffet ......... | G01J 5/02 |
| | | | 250/349 |

FOREIGN PATENT DOCUMENTS

| | | |
|---|---|---|
| CN | 102244190 A | 11/2011 |
| CN | 103344343 A | 10/2013 |
| CN | 103797345 A | 5/2014 |
| CN | 104155010 A | 11/2014 |

\* cited by examiner

THERMOPILE TEMPERATURE SENSOR FIELD OF VIEW NARROWING USING INTEGRATED LIGHT BLOCKING LAYER AND LENS

CROSS-REFERENCE TO RELATED APPLICATIONS

The present application claims the benefit under 35 U.S.C. § 119(e) of U.S. Provisional Application Ser. No. 62/139,091, filed Mar. 27, 2015, and titled "THERMOPILE TEMPERATURE SENSOR FIELD OF VIEW NARROWING USING INTEGRATED LIGHT BLOCKING LAYER AND LENS." U.S. Provisional Application Ser. No. 62/139,091 is herein incorporated by reference in its entirety.

BACKGROUND

A thermopile can include an electronic device that converts thermal energy into electrical energy. It is composed of several thermocouples often connected in series or in parallel. Thermopiles do not respond to absolute temperature, but generate an output voltage proportional to a local temperature difference or a temperature gradient. The output voltage of a thermopile can be in the range of tens or hundreds of microvolts. A thermopile can be used to generate electrical energy from, for instance, heat from electrical components, solar wind, radioactive materials, or combustion.

SUMMARY

A sensor device, a sensor package, and process for fabricating a sensor device are described that include an integrated light blocker disposed on the thermopile device and a lens configured to direct light to the thermopile device. In an implementation, the thermopile device includes a substrate; a thermopile membrane disposed on the substrate, the thermopile membrane including at least one passivation layer; a thermopile disposed within the thermopile membrane, the thermopile including at least one thermocouple; and a light blocking layer disposed proximate to the thermopile membrane, the light blocking layer including an aperture disposed proximate to the thermopile.

In another implementation, a sensor package can include a hermetic package; and a sensor device disposed within the hermetic package, the sensor device including a substrate; a sensor disposed on the substrate; and a light blocking layer disposed on the sensor, the light blocking layer including an aperture disposed proximate to an active portion of the sensor; and a package lid disposed on the hermetic package.

In an implementation, a process for fabricating a sensor device with an integrated light blocker that employs example techniques in accordance with the present disclosure includes receiving a substrate; forming a sensor on the substrate; and forming a light blocking layer on the sensor, where the light blocking layer is configured to at least one of block or reflect light, and where the light blocking layer includes an aperture configured to allow light incident upon the sensor. Additional implementations may include placing the thermopile device in a hermetic package and placing a lid on the hermetic package, where the lid includes a lens configured to direct light to the thermopile device.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Temperature sensing devices are becoming more prevalent in portable electronic devices. Thermopiles are often used for temperature sensing in semiconductor and electronic devices, such as a non-contact device. Non-contact temperature measurement using thermopile sensors is often based on Long Wavelength Infra-Red (LWIR) emissions from an object. Sometimes accurate measurement of the object from a distance may require narrowing the field of view (FOV) (e.g., for example to +/−10 degrees) to prevent other nearby objects at different temperatures from affecting the temperature measurement. The FOV may be narrowed by placing a metal aperture above the sensor and either reducing aperture width or increasing the sensor-to-aperture distance. Placing a lens above the thermopile may also limit FOV.

In a mobile handheld device application, the sensor-to-aperture distance may be limited and reducing aperture width may reduce the amount of light power incident upon the sensor, which can reduce measurement accuracy. Some temperature measurement devices may be limited because the sensor-to-aperture distance is limited and reducing aperture width reduces the amount of light power incident upon the thermopile sensor, which reduces temperature measurement accuracy. Adding a lens above the thermopile can reduce FOV somewhat, but not always to the extent required.

Accordingly, a sensor device, a sensor package, and process for fabricating a sensor device are described that include an integrated light blocker disposed on the sensor device and a lens configured to direct light to the sensor device. In an implementation, the sensor device includes a substrate; a thermopile membrane disposed on the substrate, the thermopile membrane including at least one passivation layer; a thermopile disposed within the thermopile membrane, the thermopile including at least one thermocouple; and a light blocking layer disposed proximate to the thermopile membrane, the light blocking layer including an aperture disposed proximate to the thermopile.

In another implementation, a sensor package can include a hermetic package; and a sensor device disposed within the hermetic package, the sensor device including a substrate; a sensor disposed on the substrate; and a light blocking layer disposed on the sensor, the light blocking layer including an aperture disposed proximate to an active portion of the sensor; and a package lid disposed on the hermetic package.

In an implementation, a process for fabricating a sensor device with an integrated light blocker that employs example techniques in accordance with the present disclosure includes receiving a substrate; forming a sensor on the substrate; and forming a light blocking layer on the sensor, where the light blocking layer is configured to at least one of block or reflect light, and where the light blocking layer includes an aperture configured to allow light incident upon the sensor. Additional implementations may include placing the thermopile device in a hermetic package and placing a lid on the hermetic package, where the lid includes a lens configured to direct light to the thermopile device.

The thermopile device and the thermopile temperature sensor package overcome limited sensor-to-aperture distance in a mobile device by using an aperture in the package lid and positioning a light blocking layer with an aperture directly on the thermopile membrane. The aperture in the package lid serves to limit the field of view, and the aperture of the light blocking layer serves to selectively allow a portion of light within the field of view to reach the thermopile membrane and thermopile. By placing this light blocking layer with an aperture on the thermopile itself, the distance between the thermopile device and the package lid aperture and/or lens is effectively maximized, thus maximizing its effect on the field of view.

Example Implementations

FIGS. 1A through 1D illustrate a sensor device 100 and a sensor package 102 in accordance with an example implementation of the present disclosure. The sensor and sensor package described herein can include, for example, a thermopile temperature sensor, a thermopile temperature sensor package, an optical sensor, and/or another thermal sensor. Some other examples of sensors can include a microbolometer, a pyroelectric detector, and/or a carbon nanotube sensor. It is contemplated that other types of sensors or sensor combinations may be utilized in the sensor device 100 and/or the sensor package 102.

Figure 1A:
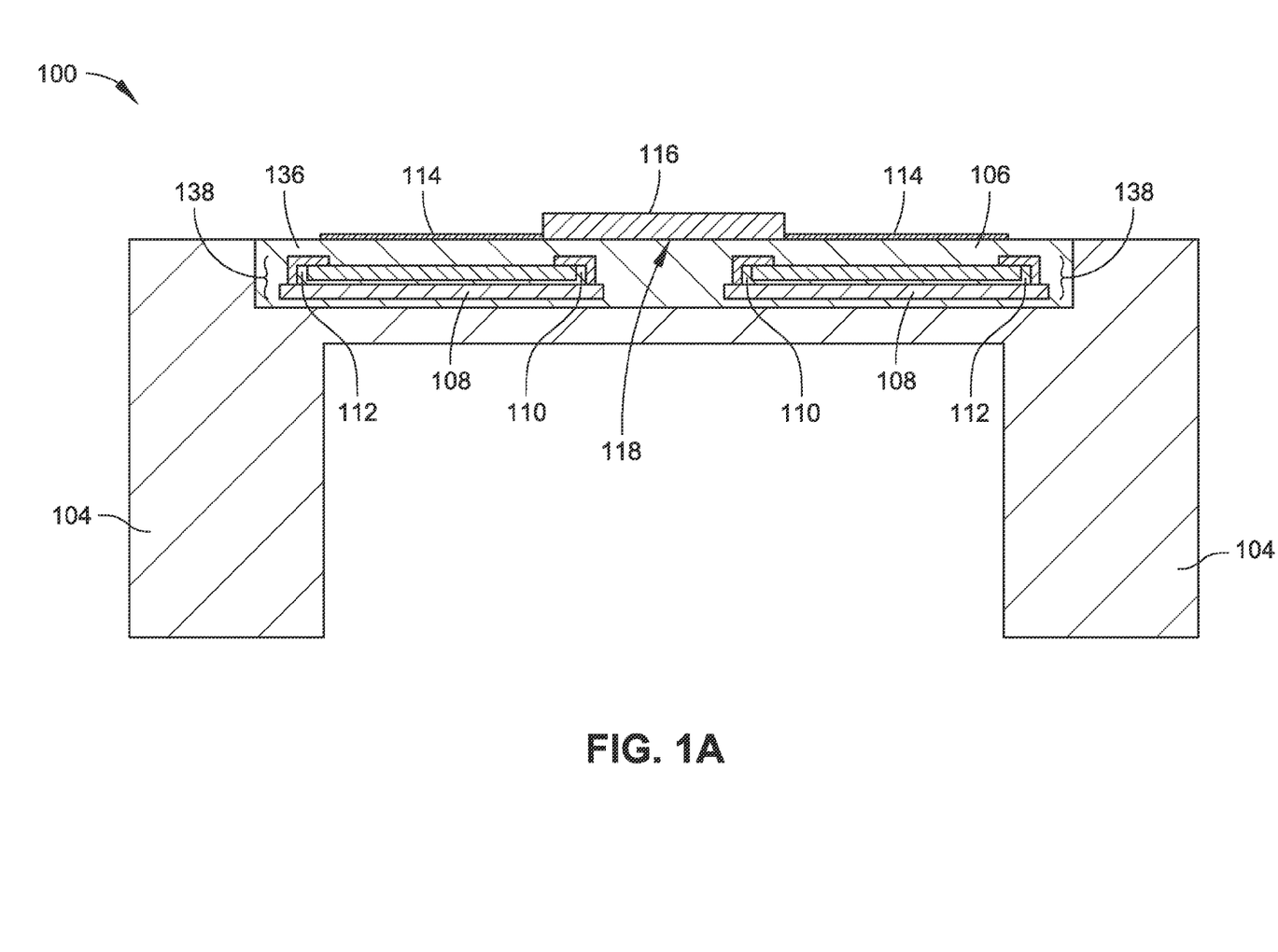
FIG. 1A is a cross section side view illustrating an embodiment of a sensor device that includes a thermopile membrane having a light blocking layer with an aperture, in accordance with an example implementation of the present disclosure.
Figure 1B:
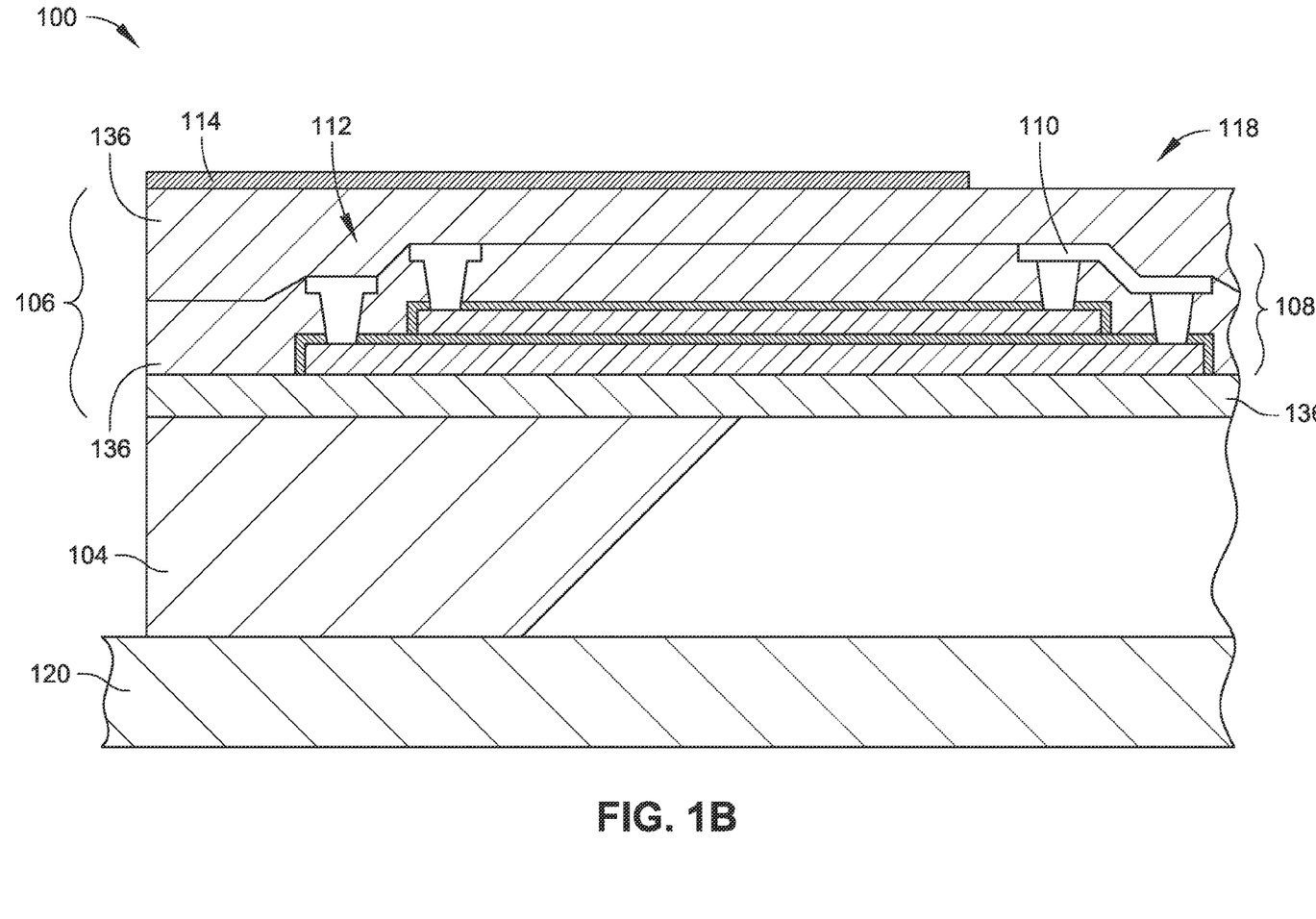
FIG. 1B is a partial cross section side view illustrating an embodiment of a sensor device that includes a light blocking layer with an aperture, in accordance with an example implementation of the present disclosure.
Figure 1C:
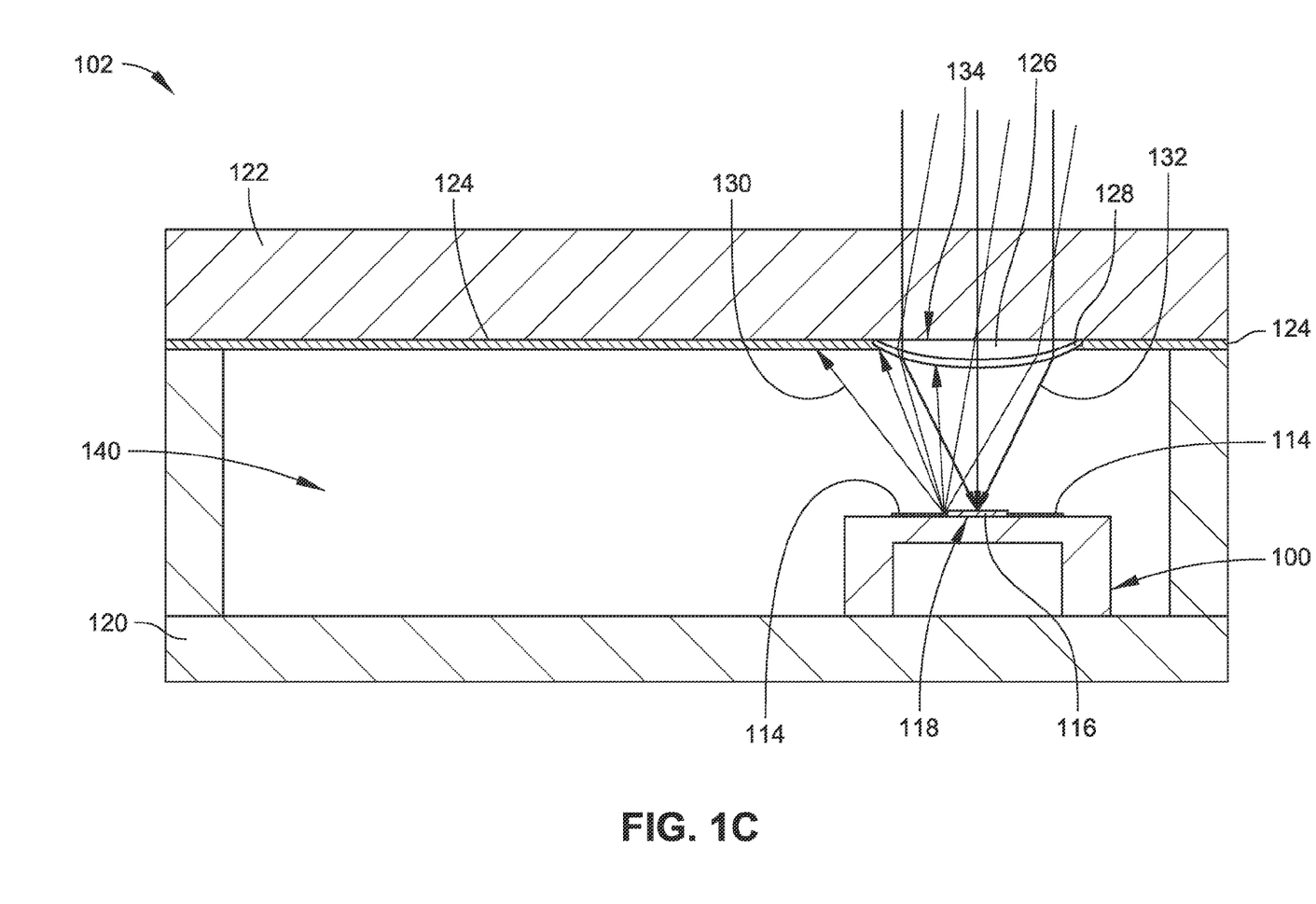
FIG. 1C is a cross section side view illustrating an embodiment of a sensor device that includes a thermopile device and a package lid with an aperture and lens, in accordance with an example implementation of the present disclosure.

As shown in FIGS. 1A through 1C, the sensor device 100 can include a substrate 104. The substrate 104 can be configured to mechanically support a thermopile membrane 106, a sensor, and/or other components. In some implementations, a substrate 104 may include a silicon substrate. In other implementations, the substrate 104 may include a hermetic substrate or other materials. In the embodiment shown in FIGS. 1A through 1C, the substrate 104 can include a wafer (e.g., silicon wafer) or other material that is etched to form a cavity or other area for a thermopile membrane 106. This cavity can be disposed on top of the substrate 104 (e.g., a side of the substrate 104 exposed to a package lid 122) and/or can be disposed on the bottom of the substrate 104 (e.g., a side of the substrate 104 distal from the package lid 122). The substrate 104 may also be etched to form other cavities and/or features (e.g., a cavity underneath the thermopile membrane 106, or between a hermetic package 120 and a thermopile membrane 106, etc.). In some specific embodiments, the substrate 104 may include a set of pillars and/or columns that support a sensor. In a specific example, a substrate 104 includes a set of silicon columns on which a thermopile sensor is disposed, where the bottom layer of the thermopile sensor includes a passivation layer and/or a dielectric layer. In a specific embodiment, the substrate 104 can include a support structure (e.g., a pedestal) for the thermopile membrane 106 while forming a cavity 140 between the thermopile membrane 106 and a hermetic package 120. Additionally, the substrate 104 can include electrical interconnections for electrically coupling a sensor device 100 with other components of a sensor package 102. For example, the substrate 104 can include a redistribution layer, vias, contact pads, and/or other metal routing or components.

As illustrated in FIGS. 1A through 1C, the sensor device 100 may include a thermopile membrane 106. The thermopile membrane 106 can be generally configured to receive light (e.g., received light 132) from outside the sensor device 100 and/or sensor package 102. The thermopile membrane 106 can include at least one passivation layer 136, a thermopile 138, and/or electrical interconnections.

In implementations, the passivation layer 136 can include an electrical insulator that functions as an insulator and/or a protective layer between layers and/or other components of the thermopile membrane 106. In some embodiments, the passivation layer 136 (or a dielectric layer) may provide a base material for the thermopile membrane 106. In one embodiment, the passivation layer 136 can include at least one layer of silicon dioxide ($SiO_2$). In another embodiment, the passivation layer 136 may include an organic thin film (e.g., benzocyclobutene (BCB), etc.). In some implementations, the passivation layer 136 can include one or more material layers that may include the same or different dielectric materials. For example, the passivation layer 136 can include a first polymer layer and a second polymer layer with multiple thermocouples 108 and a thermopile 138 formed between the first polymer layer and the second polymer layer. It is contemplated that the thermopile membrane 106 can include other numbers of layers and other layer materials.

In implementations, the thermopile membrane 106 and/or the passivation layer 136 can be formed and/or deposited using deposition (e.g., physical vapor deposition, chemical vapor deposition, spin coating, etc.), photolithography, and/or etching techniques. Additionally, the thermopile membrane 106 can be formed and/or fabricated prior to placement on the substrate 104 or as a component of the sensor device 100 and substrate 104.

In implementations, the sensor device 100 can include a thermopile 138, which can further include at least one thermocouple 108. A thermopile 138 can include an electronic device that converts thermal energy into electrical energy. In these implementations, the thermopile 138 and thermocouple(s) 108 can detect infrared radiation and provide a proportional electrical signal for determining an object's temperature. A thermopile can include several thermocouples 108 or temperature sensors connected in series and/or in parallel and can include a temperature-measuring device having two dissimilar conductors that contact each other at one or more spots (e.g., a hot junction 110, a cold junction 112) where a temperature differential is experienced by the different conductors (or semiconductors). In embodiments, the thermopile 138 and/or thermocouple(s) 108 can be disposed on and/or within the thermopile membrane 106 and configured to be exposed to and/or receive light and/or electromagnetic radiation. In a specific embodiment, a thermopile 138 utilized in a sensor device 100 can be configured to be exposed to light and/or infrared radiation through an aperture 118 in a light blocking layer 114, which is further described below. In this embodiment, the thermopile 138 can be configured to receive and/or detect electromagnetic energy (e.g., energy from a human or other object) external to the sensor device 100. Additionally, the thermopile 138 can be electrically coupled to other components (e.g., controller 142) within the sensor device 100 and/or sensor package 102, for example, using electrical interconnections such as a redistribution layer, vias, metal wiring, metal traces, etc.

As illustrated in FIGS. 1A through 1C, the sensor device 100 can include a light blocking layer 114. In implementations, the light blocking layer 114 can be disposed on the thermopile membrane 106. The light blocking layer 114 can include a layer of metal, for example, configured to block and/or reflect light (e.g., a light reflecting layer) from at least a part of the thermopile membrane 106 while minimally affecting the thermal conductivity of the thermopile membrane 106. In an embodiment, a light blocking layer 114 can be deposited on the thermopile membrane 106 using, for example, a sputtering process. In one specific embodiment, a light blocking layer 114 can be disposed between the thermopile membrane 106 and a package lid 122 without being in contact with the thermopile membrane 106. In this specific embodiment, the light blocking layer 114 may be suspended and/or supported over a thermopile membrane 106. In this specific embodiment, the light blocking layer 114 can be supported by at least one pedestal and/or column (e.g., a set of ceramic pedestals, silicon columns, etc.) and/or substrate 104 above the surface of the thermopile membrane 106. An aperture 118 in the light blocking layer 114 can be aligned with the thermopile membrane 106 and/or hot junction(s) 110 of the thermocouples 108.

In implementations, the light blocking layer 114 can include a material with low conductivity and/or a thin material layer with a somewhat higher conductivity. The light blocking layer 114 material can be selected for a low thermal conductivity and so that heat flux between the hot junction(s) 110 and cold junction(s) 112 within the thermopile membrane 106 is minimized. Some exemplary materials used for the light blocking layer 114 can include a reflective polymer, a light blocking/reflecting metal, such as aluminum, copper, and/or gold, and/or other material (e.g., TiN, etc.).

In some implementations, the light blocking layer 114 may be formed and disposed directly on the thermopile membrane 106. In other implementations, the light blocking layer 114 may be formed above but not in contact with the thermopile membrane 106. In these other implementations, the light blocking layer 114 may be supported with a support structure, such as a set of columns and/or pedestals.

In implementations, the light blocking layer 114 may be fabricated using processes such as deposition (e.g., physical vapor deposition, sputtering, etc.), photolithography (e.g., deposition and/or etching of photoresist), and/or etching (e.g., using a dry and/or wet etch to remove a portion of the photoresist and/or light blocking material). In a specific embodiment, the aperture 118 may be formed in the light blocking layer 114 using an etch process (e.g., dry etch, wet etch, etc.).

Additionally, the light blocking layer 114 can include an aperture 118. The aperture 118 can be formed over the thermopile membrane 106 and/or the hot junction(s) 110 of the thermocouple(s) 108 in the thermopile 138 such that at least some light and/or infrared radiation received by the sensor device 100 is allowed to pass through/into the thermopile membrane 106. In specific embodiments, the aperture 118 can be disposed over only the hot junction(s) 110 and not the cold junction(s) 112.

In some embodiments, shown in FIGS. 1A and 1C, an absorber layer 116 may be disposed within the aperture 118 and/or on and/or within the thermopile membrane 106. In implementations, the absorber layer 116 can be configured to absorb and/or block at least a portion of or specific wavelength(s) of light and/or infrared radiation passing through the thermopile 138 through the aperture 118. For example, the absorber layer 116 can include a polymer ink disposed on the thermopile membrane 106 and within the aperture 118. In another example, the absorber layer 116 may include a passivation and/or dielectric material disposed within the aperture 118. In some instances, absorber layer 116 may be integrated with the thermopile membrane 106 and/or may include multiple layers (e.g., a layer with reflective characteristics that can reflect certain light wavelengths, a long wavelength infra-red (LWIR) material that provides wave phase shift, a layer that provides absorption and/or reflective characteristics, etc.). In examples, the absorber layer 116 can include a material or a combination of materials, such as n-type poly-silicon, aluminum, amorphous silicon, germanium, and/or titanium, etc.

FIG. 1B illustrates a specific example of a sensor device 100 and thermopile membrane 106. The illustration in FIG. 1B shows the exemplary sensor device 100 disposed on a bottom surface of a hermetic package 120. The sensor device 100 shown in FIG. 1B includes a substrate 104, a first portion of the passivation layer 136 formed on the substrate 104 and over a cavity defined between the hermetic package 120, the substrate 104, and the first portion of the passivation layer 136, at least one thermopile 138, a second portion of the passivation layer 136, and a light blocking layer 114 with an aperture 118. In the specific example shown in FIG. 1B, the passivation layer 106 includes multiple layers, sections, and portions (e.g., a dielectric layer formed on the substrate, a dielectric layer formed within the thermopile 138 and thermocouples 108, and a dielectric layer formed over the thermopile(s) 138 that the light blocking layer 114 is disposed upon). It is contemplated that the sensor device 100 can include other layer configurations.

As shown in FIG. 1C, a sensor package 102 can include a sensor device 100 as described above placed within a hermetic package 120. The hermetic package 120 can include a structure, such as a substrate (e.g., a bottom side) and/or at least one wall, configured to house the sensor device 100 and/or other components. In implementations, the hermetic package 120 can at least partially define a cavity 140, in which the sensor device 100 can be disposed.

In implementations, the hermetic package 120 can include an optical blocking material that allows for a hermetic package. For example, the hermetic package may include ceramic, glass, a nickel-cobalt ferrous alloy (e.g., Kovar), silicon, and/or an optical blocking coating. In specific embodiments, the hermetic package 120 can include a ceramic structure formed from a photodefinable (photostructurable) glass. In these specific implementations, photodefinable glass can include sensitizers that allow unique anisotropic 3D features to be formed through exposure to ultraviolet (UV) light and subsequent baking and etching of ceramic formed after exposure to the UV light. In one specific embodiment, the hermetic package 120 may include a photodefinable glass structure where the photodefinable glass is chemically inert, and thermally stable. In this embodiment, the photodefinable glass layer can be exposed to light, baked, and etched to form a hermetic package 120 suitable for defining cavity 140 and supporting a package lid 122. During the light exposure and etching processes, different features may be formed, such as a wall and/or a partition. At least some of these features (e.g., walls, substrate, etc.) can be configured to facilitate electrical interconnections (e.g., vias, a redistribution layer, metal lines, contact pads, etc.). In a specific embodiment, the photodefinable glass layer can be converted to a ceramic state and partially left un-etched, for example, to form a light isolation component. In other implementations, a package formed from other materials (e.g., a polymer, silicon, etc.) may be utilized to house the sensor device 100. For example, a silicon-based package may be used instead of ceramic.

As illustrated in FIG. 1C, the sensor package 102 can include a package lid 122 disposed on the hermetic package 120. As shown in FIG. 1C, the sensor package 102 can include a package lid 122 disposed on and coupled to the hermetic package 120. In some embodiments, the package lid 122 can be hermetically sealed to the hermetic package 120. The package lid 122 and the hermetic package 120 can define a cavity 140 that houses the sensor device 100. In one embodiment, the package lid 122 may include a silicon lid. It is contemplated that the package lid 122 can include other materials. The package lid 122 can be configured to block light and/or infrared radiation from the cavity 140 and/or components (e.g., sensor device 100) except where desired and to serve as mechanical protection. In some embodiments, the package lid 122 can be electrically interconnected with the hermetic package 120.

In some embodiments, package lid 122 may include a metal layer 124 disposed on at least one side of the package lid 122. The metal layer 124 may be configured to serve as a light blocking layer and/or a light absorbing layer for the sensor package 102 and/or to ensure that little or no light passes through the package lid 122 and into the cavity 140 except for light passing through a lid aperture 134 and/or a lens 126. Additionally, the metal layer 124 may function to absorb reflected light 130 from the light blocking layer 114 disposed on the sensor device 100 or light within cavity 140. In one specific embodiment, the metal layer 124 can be disposed on a side of the package lid 122 configured to be exposed to the cavity 140. It is contemplated that the metal layer 124 can be disposed and configured other ways, such as on the top of the package lid 122 (e.g., on a side distal from cavity 140) and/or as a layer within the package lid 122. In some embodiments, the metal layer 124 and/or the package lid 122 may include a lid aperture 134 configured to allow some light and/or infrared radiation into the cavity 140 and/or to be incident upon a sensor device 100. The lid aperture 134 may function as a field-of-view (FOV) limiter for the thermopile temperature sensor package 100. In implementations, the metal layer 124 can surround at least part of the lens 126.

As shown in FIG. 1C, the package lid 122 may include a lens 126 and/or a filter 128. A lens 126 can include an optical device configured to transmit and/or refract light, such as a ball lens, a Fresnel lens, and/or other diffractive optics element lenses. In some implementations and as shown in FIG. 1C, a lens 126 can be placed as a part of the package lid 122 and/or within the lid aperture 134. The lens 126 may be aligned with the optically active portion of the sensor device 100 (e.g., the thermopile membrane 106, aperture 118) such that light and/or infrared radiation from an object and incident upon the sensor package 102 can pass through the package lid 122 to the sensor device 100. When the lens 126 is aligned above the sensor device 100, the lens 126 focuses/directs light onto the sensor portion of the sensor device 100 (e.g., the thermopile membrane 106 and the thermopile 138). The lens radius of curvature can determine focal length and the lens diameter can determine the light power incident on the sensor device 100. In some examples, the lens 126 can be made of silicon (Si), a polymer, germanium (Ge), a chalcogenide glass, amorphous material transmitting infrared radiation (AMTIR), diamond, and/or any other appropriate long wave infrared material (LWIR) lens material. In one specific example, a lens 126 may include a Si lens fabricated by using a resist reflow technique followed by dry etch transfer into Si).

In some embodiments, the lens 126 may include at least one filter 128 disposed on at least one side of the lens 126. A filter can serve to selectively transmit, absorb, and/or block light of different wavelengths. For example, a filter 128 can include an anti-reflective filter configured to reduce and/or eliminate the reflection of light. In another example, a filter 128 can include a visible light filter configured to block visible light but let infrared waves pass. In one specific embodiment, the lens 126 can include both an anti-reflective filter and an infrared filter. It is contemplated that other types and/or numbers of filters may be utilized in the sensor device 100 and sensor package 102.

In one specific implementation, the sensor device 100 may be coupled to package lid 122 including a light blocking layer 114. In this implementation, the sensor device 100 may be disposed on a side of the package lid 122 exposed to cavity 140. In this implementation, a lid aperture 134 may be formed (e.g., etched) and aligned with the thermopile membrane 106. In some instances, coupling the sensor device 100 to the package lid 122 may be performed on a wafer level and each package subsequently singulated.

Referring to FIGS. 1A through 1D, a sensor package 102, including some or all of its components, can operate under computer control. For example, a processor 144 can be included with or in a sensor package 102 and/or controller 142 to control the components and functions of sensor package 102 described herein using software, firmware, hardware (e.g., fixed logic circuitry), manual processing, or a combination thereof. The terms "controller," "functionality," "service," and "logic" as used herein generally represent software, firmware, hardware, or a combination of software, firmware, or hardware in conjunction with controlling the sensor package 102. In the case of a software implementation, the module, functionality, or logic represents program code that performs specified tasks when executed on a processor (e.g., central processing unit (CPU) or CPUs). The program code can be stored in one or more computer-readable memory devices (e.g., internal memory and/or one or more tangible media), and so on. The structures, functions, approaches, and techniques described herein can be implemented on a variety of commercial computing platforms having a variety of processors.

Figure 1D:
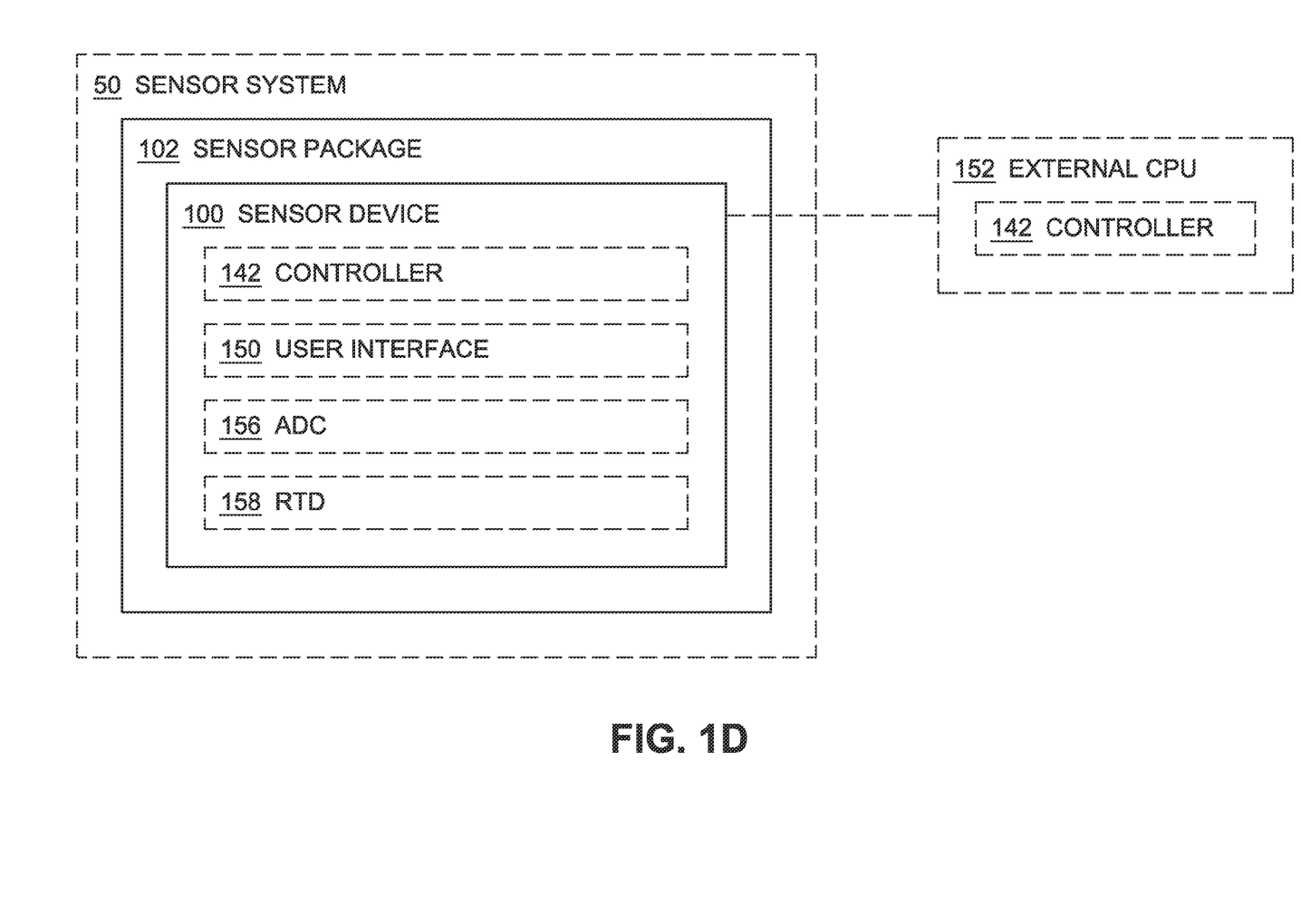
FIG. 1D is an environmental view illustrating an embodiment of a sensor package that includes a controller, in accordance with an example implementation of the present disclosure.
Figure 1E:
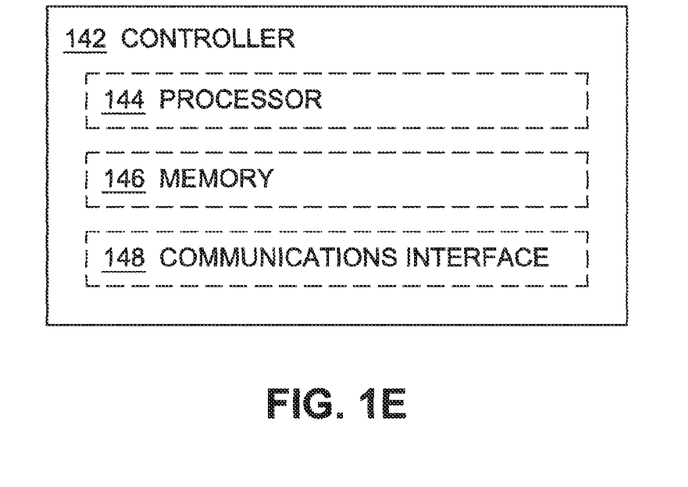
FIG. 1E is an environmental view illustrating an embodiment of a controller that can be used with a sensor device and/or a sensor package, in accordance with an example implementation of the present disclosure.

Illustrated in FIGS. 1D and 1E, the sensor package 102 can be coupled with a controller 142 for controlling the sensor package 102. The controller 142 can include a processor 144, a memory 146, and a communications interface 148. In some embodiments, the controller 142 may be integrated into an integrated circuit (IC) with a user interface 150 (e.g., controls, a readout, etc.) for the sensor package 102. In other embodiment, the controller 142, processor 144, memory 146, communications interface 148, and/or user interface 150 may be integrated into one system-in-package/module and/or one or more could be separate discrete components in an end system (e.g., sensor package 102).

The processor 144 provides processing functionality for the sensor package 102/controller 142 and can include any number of processors, micro-controllers, or other processing systems, and resident or external memory for storing data and other information accessed or generated by the sensor package 102/controller 142. The processor 144 can execute one or more software programs that implement techniques described herein. The processor 144 is not limited by the materials from which it is formed or the processing mechanisms employed therein and, as such, can be implemented via semiconductor(s) and/or transistors (e.g., using electronic integrated circuit (IC) components), and so forth.

The controller 142 may include a memory 146. The memory 146 can be an example of tangible, computer-readable storage medium that provides storage functionality to store various data associated with operation of the sensor package 102/controller 142, such as software programs and/or code segments, or other data to instruct the processor 144, and possibly other components of the sensor package 102/controller 142, to perform the functionality described herein. Thus, the memory 146 can store data, such as a program of instructions for operating the sensor package 102 (including its components), and so forth. It should be noted that while a single memory 146 is described, a wide variety of types and combinations of memory (e.g., tangible, non-transitory memory) can be employed. The memory 146 can be integral with the processor 144, can comprise stand-alone memory, or can be a combination of both.

The memory 146 can include, but is not necessarily limited to: removable and non-removable memory components, such as random-access memory (RAM), read-only memory (ROM), flash memory (e.g., a secure digital (SD) memory card, a mini-SD memory card, and/or a micro-SD memory card), magnetic memory, optical memory, universal serial bus (USB) memory devices, hard disk memory, external memory, and so forth. In implementations, the sensor package 102 and/or the memory 146 can include removable integrated circuit card (ICC) memory, such as memory provided by a subscriber identity module (SIM) card, a universal subscriber identity module (USIM) card, a universal integrated circuit card (UICC), and so on.

The controller 142 may include a communications interface 148. The communications interface 148 can be operatively configured to communicate with components of the sensor package 102. For example, the communications interface 148 can be configured to transmit data for storage in the sensor package 102, retrieve data from storage in the sensor package 102, and so forth. The communications interface 148 can also be communicatively coupled with the processor 144 to facilitate data transfer between components of the sensor package 102 and the processor 144 (e.g., for communicating inputs to the processor 144 received from a device communicatively coupled with the sensor package 102/controller 142). It should be noted that while the communications interface 148 is described as a component of a sensor package 102/controller 142, one or more components of the communications interface 148 can be implemented as external components communicatively coupled to the sensor package 102 via a wired and/or wireless connection. The sensor package 102 can also comprise and/or connect to one or more input/output (I/O) devices (e.g., via the communications interface 148), including, but not necessarily limited to a display, a mouse, a touchpad, a keyboard, and so on.

The communications interface 148 and/or the processor 144 can be configured to communicate with a variety of different networks, including, but not necessarily limited to: a wide-area cellular telephone network, such as a 3G cellular network, a 4G cellular network, or a global system for mobile communications (GSM) network; a wireless computer communications network, such as a Wi-Fi network (e.g., a wireless local area network (WLAN) operated using IEEE 802.11 network standards); an internet; the Internet; a wide area network (WAN); a local area network (LAN); a personal area network (PAN) (e.g., a wireless personal area network (WPAN) operated using IEEE 802.15 network standards); a public telephone network; an extranet; an intranet; and so on. However, this list is provided by way of example only and is not meant to limit the present disclosure. Further, the communications interface 148 can be configured to communicate with a single network or multiple networks across different access points.

Generally, any of the functions described herein can be implemented using hardware (e.g., fixed logic circuitry such as integrated circuits), software, firmware, manual processing, or a combination thereof. Thus, the blocks discussed in this disclosure generally represent hardware (e.g., fixed logic circuitry such as integrated circuits), software, firmware, or a combination thereof. In the instance of a hardware configuration, the various blocks discussed in the above disclosure may be implemented as integrated circuits along with other functionality. Such integrated circuits may include all of the functions of a given block, system, or circuit, or a portion of the functions of the block, system, or circuit. Further, elements of the blocks, systems, or circuits may be implemented across multiple integrated circuits. Such integrated circuits may comprise various integrated circuits, including, but not necessarily limited to: a monolithic integrated circuit, a flip chip integrated circuit, a multichip module integrated circuit, and/or a mixed signal integrated circuit. In the instance of a software implementation, the various blocks discussed in the above disclosure represent executable instructions (e.g., program code) that perform specified tasks when executed on a processor. These executable instructions can be stored in one or more tangible computer readable media. In some such instances, the entire system, block, or circuit may be implemented using its software or firmware equivalent. In other instances, one part of a given system, block, or circuit may be implemented in software or firmware, while other parts are implemented in hardware.

As shown in in FIG. 1D, the sensor package 102 may include a user interface 150. In implementations, a user interface 150 can include a device configured to display information to a user. Some examples of a user interface 150 can include a display screen and/or a touch screen. In one specific embodiment, a user interface 150 can include a touch screen that is coupled to controller 142 and is configured to present information to a user. In this specific embodiment, the user interface 150 may also receive input from a user and transmit the input to the controller 142.

A sensor system 50 may include a sensor package 102, which can be electrically and/or mechanically coupled to an external device, such as a printed circuit board (not shown) and/or an external central processing unit (CPU) 152. The sensor package 102 may include other components, such as other channels of thermopiles, thermistors, a reference temperature detector (RTD) 158, and/or an analog-to-digital converter 156 (an ADC, which may be included in an application specific integrated circuit (ASIC) including digital functions). Moreover, the controller 142 may transmit data to an external CPU, such as an applications processor and/or a microprocessor. The controller 142, microprocessor, and/or external CPU may be configured to determine a calculated object temperature using raw data received from the sensor device 100 and/or thermopile temperature sensor 102.

Example Processes

Figure 2:
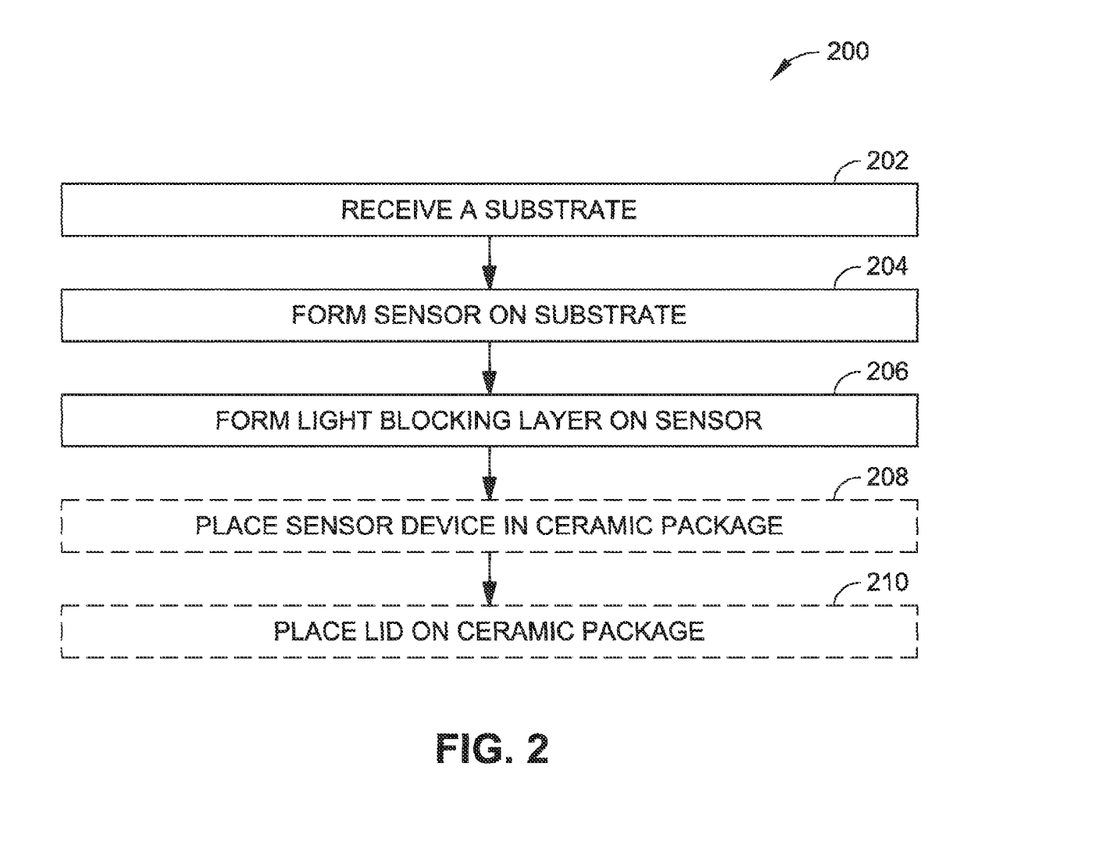
FIG. 2 is a flow diagram illustrating an example process for fabricating a thermopile device and thermopile temperature sensor that includes a light blocking layer disposed on the thermopile device and a package lid with an aperture and a lens, such as the thermopile device and the thermopile temperature sensor illustrated in FIGS. 1A and 1B.

FIG. 2 illustrates an example process 200 that employs techniques to fabricate thermopile temperature sensing devices, such as the sensor device 100 and sensor package 102 shown in FIGS. 1A and 1B. FIGS. 3A through 3D illustrate a section 300 of a sensor device 100 and sensor package 102 during fabrication for example those shown in FIGS. 1A and 1B.

Figure 3A:
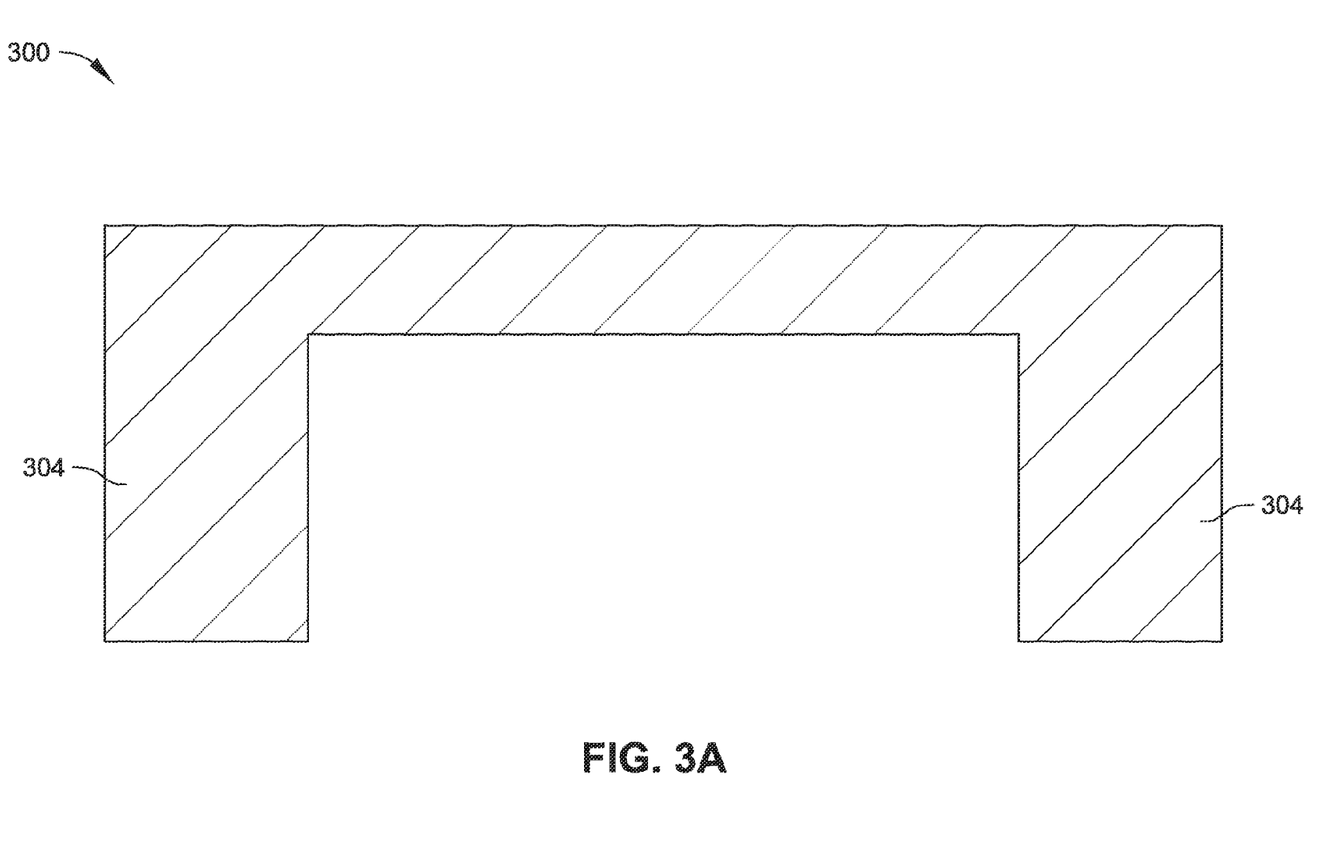
FIG. 3A is a diagrammatic partial cross-sectional side elevation view illustrating the fabrication of a thermopile device and thermopile temperature sensor, such as the thermopile device and thermopile temperature sensor shown in FIGS. 1A and 1B in accordance with the process shown in FIG. 2.
Figure 3B:
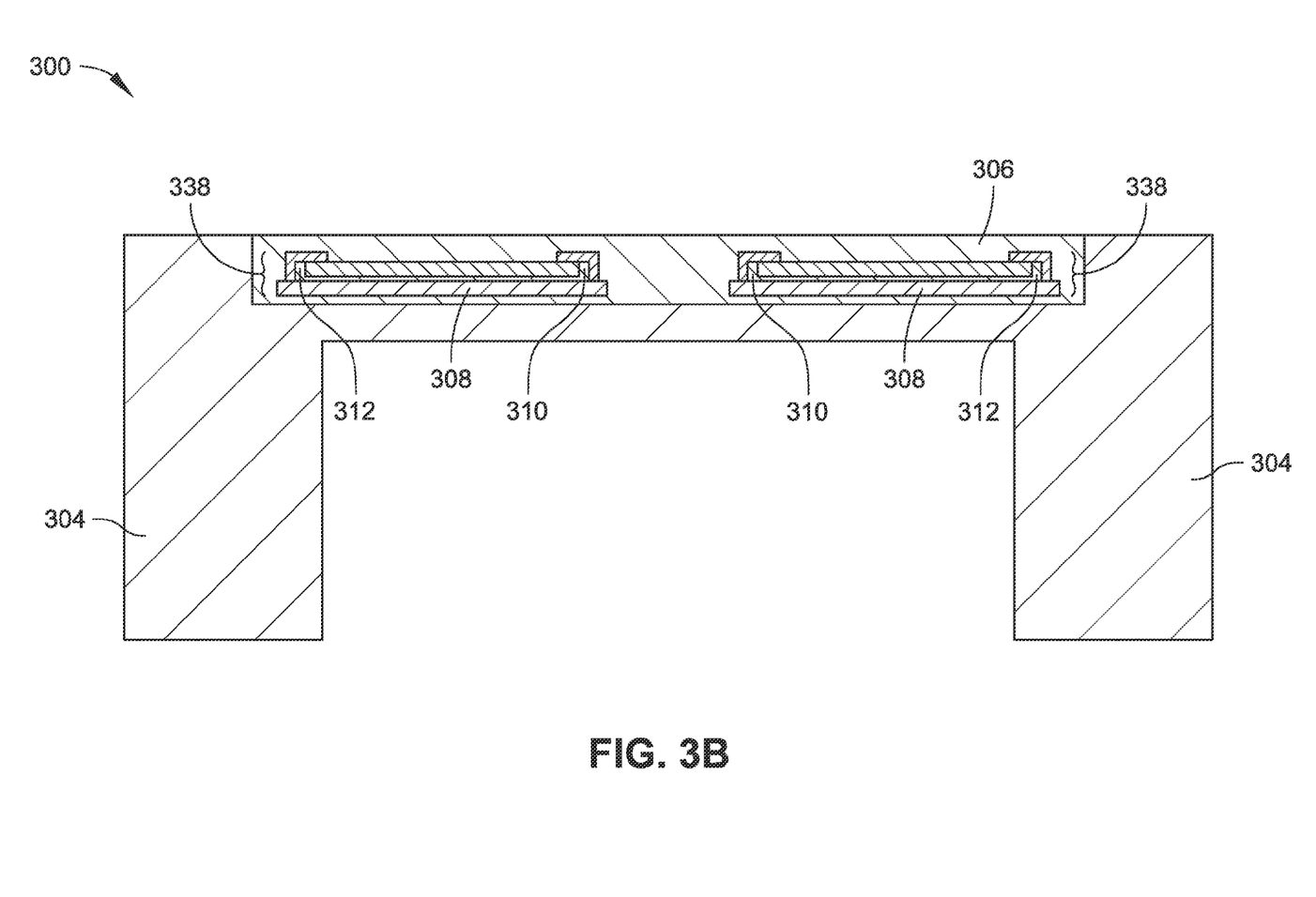
FIG. 3B is a diagrammatic partial cross-sectional side elevation view illustrating the fabrication of a thermopile device and thermopile temperature sensor, such as the thermopile device and thermopile temperature sensor shown in FIGS. 1A and 1B in accordance with the process shown in FIG. 2.
Figure 3C:
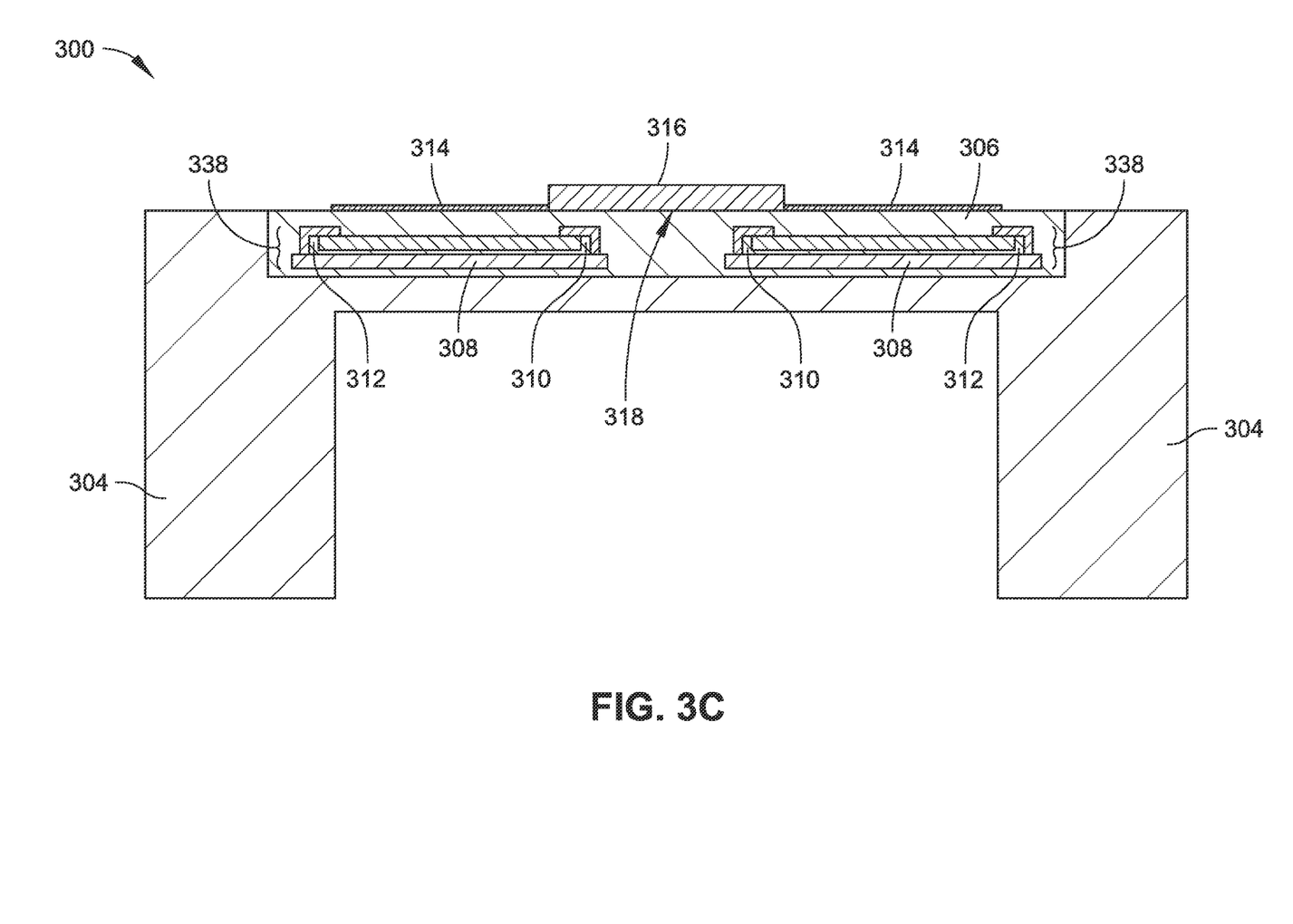
FIG. 3C is a diagrammatic partial cross-sectional side elevation view illustrating the fabrication of a thermopile device and thermopile temperature sensor, such as the thermopile device and thermopile temperature sensor shown in FIGS. 1A and 1B in accordance with the process shown in FIG. 2.
Figure 3D:
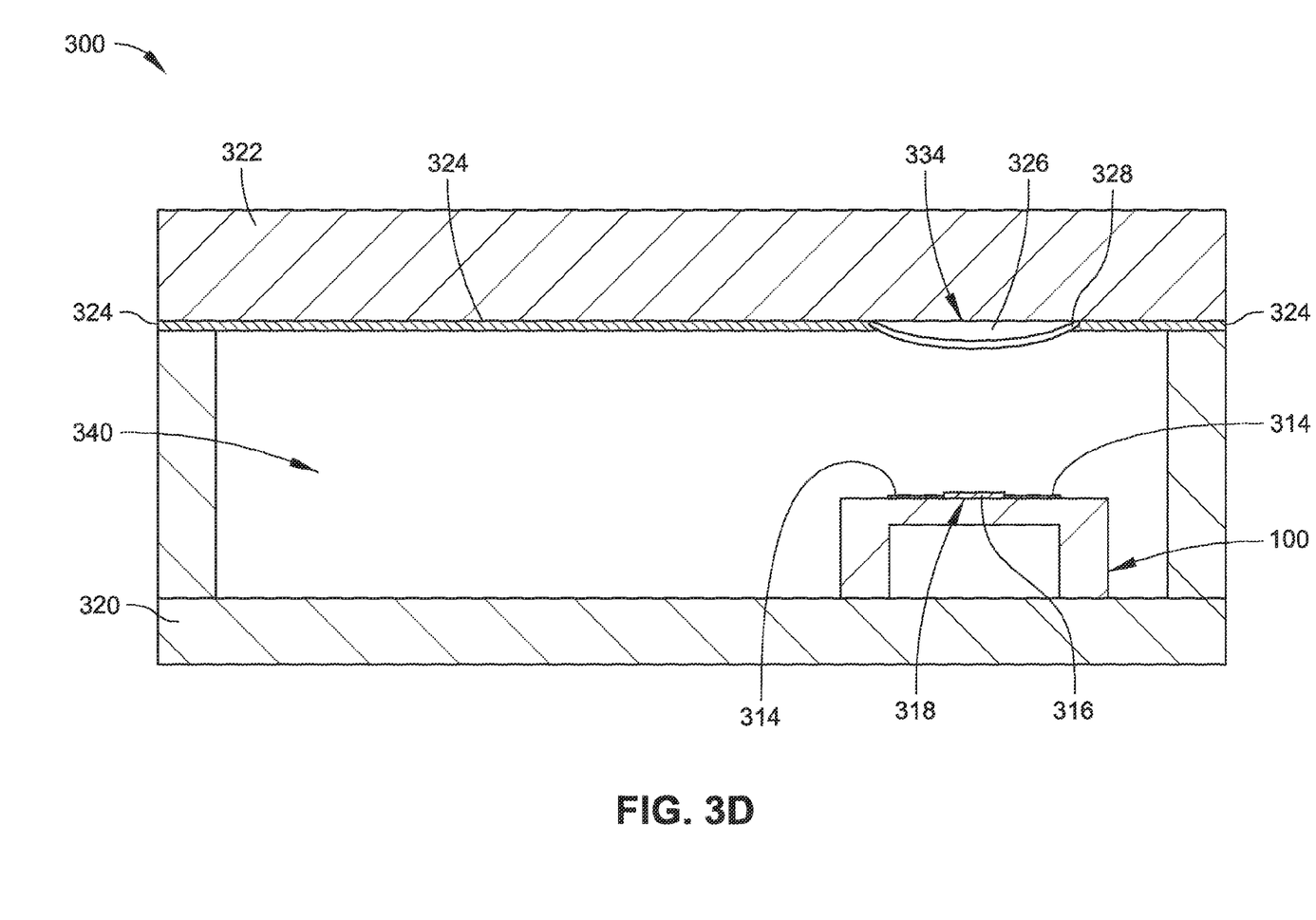
FIG. 3D is a diagrammatic partial cross-sectional side elevation view illustrating the fabrication of a thermopile device and thermopile temperature sensor, such as the thermopile device and thermopile temperature sensor shown in FIGS. 1A and 1B in accordance with the process shown in FIG. 2.

In the process 200 illustrated, a substrate is received (Block 202). As shown in FIG. 3A, receiving a substrate 304 can include receiving a silicon substrate, a ceramic substrate, or other mechanical support configured to mechanically and/or electrically support a thermopile membrane 306. In some instances, receiving the substrate 304 may include receiving a substrate 304 that has been etched to form a cavity in which a thermopile membrane 306 is disposed. In one specific example, receiving the substrate 304 can include receiving a silicon substrate configured in the form of at least one pedestal for supporting a thermopile membrane 306. In another specific example, receiving the substrate 304 can include receiving a silicon substrate in another form, such as a square or rectangle shape (e.g., four connected walls). It is contemplated that receiving the substrate 304 can include receiving other substrate shapes and/or forms that are configured to support the thermopile membrane 306. In some implementations, receiving the substrate 304 may include forming the substrate using deposition, photolithography, and/or etching processes. In one specific example, receiving the substrate 304 may include forming the substrate 304 from a silicon wafer and selectively etching the silicon wafer to form a silicon substrate. In another specific implementation, receiving the substrate 304 can include forming a ceramic substrate 304 from a photo-definable (photo-structurable) glass using light exposure, baking, and subsequent etching. The substrate 304 can be configured to include a thermopile membrane 306 in order to form a section 300 of a sensor device 100.

Then, a thermopile membrane is formed on the substrate (Block 204). In some implementations, forming a thermopile membrane 306 can include etching the substrate 304 to form a cavity for the thermopile membrane 306. Forming the thermopile membrane 306 can include forming/placing at least one passivation layer 306 and forming and/or placing a thermopile 138 within the cavity etched into the substrate 304 using deposition, photolithography, etching, and/or other deposition techniques where the thermopile 138 can include at least one thermocouple 308 with a hot junction 310 and/or a cold junction 312.

Next, a light blocking layer is formed on the thermopile membrane (Block 206). In implementations, forming a light blocking layer 314 can include using a deposition process (e.g., physical vapor deposition, sputtering, etc.). In one specific embodiment, forming a light blocking layer 314 may include sputtering an aluminum layer on the thermopile membrane 306. The light blocking layer 314 can be formed such that it limits and/or prevents light and/or infrared radiation from reaching the thermopile membrane 306. Additionally, forming a light blocking layer 314 may include forming an aperture 318 and/or an absorber layer 316 in the light blocking layer 314 and over at least one hot junction 310 in a thermocouple 308. The light blocking layer 314 can include multiple apertures, and the aperture(s) 318 may include different shape configurations (e.g., circular, oval, an irregular shape, etc.). Forming the aperture 318 may include using a photolithography and/or etching process. Forming the absorber layer 316 may include using a deposition (e.g., printing, etc.) and/or etching process. Additionally, forming the absorber layer 316 may include integrating the absorber layer 316 within the thermopile membrane 306 using back-end processing.

The thermopile device may be placed in a hermetic package (Block 208). Placing the sensor device 100 in a hermetic package 320 can include using an automated process, such as pick-and-place technology, to place and couple the sensor device 100 to a surface of the hermetic package 320. In some instances, placing the sensor device 100 may include forming the sensor device 100 within the hermetic package 320. In an example, placing the sensor device 100 can include using an adhesive and/or bonding material to couple the sensor device 100 to the hermetic package 320. In other examples, the sensor device 100 may include contact pads (not shown) configured to couple to corresponding contact pads (not shown) on the hermetic package 320. In these other examples, placing the sensor device 100 can include using a soldering and/or reflow process to couple the contact pads on the sensor device 100 and the hermetic package 320. The sensor device 100 may be placed such that it is aligned with a lid aperture 334, lens 326, and/or filter 328 formed in the package lid 322.

A package lid may be placed on the hermetic package (Block 210). Placing the package lid 322 may include using pick-and-place and/or surface mount technologies and an adhesive (e.g., a die attach epoxy, etc.) to couple the package lid 322 to the top surface of the hermetic package 320 such that the sensor device 100 is enclosed within the hermetic package 320 and cavity 340 is formed. In implementations, the package lid 322 can be hermetically sealed to the hermetic package 320. Additionally, placing the package lid 322 on the hermetic package 320 may include forming a metal layer 324 and/or lid aperture 334 in the metal layer

324. The package lid 322 may be placed such that lid aperture 334 is aligned with the sensor device 100.

Conclusion

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A thermopile device, comprising:
   a substrate including a support structure;
   a thermopile membrane disposed on the substrate and the support structure, the support structure configured to form a cavity between the thermopile membrane and a hermetic package, the thermopile membrane including at least one passivation layer;
   a thermopile disposed within the thermopile membrane, the thermopile including at least one thermocouple; and
   a light blocking layer disposed proximate to the thermopile membrane, the light blocking layer including an aperture disposed proximate to the thermopile.

2. The thermopile device of claim 1, wherein the light blocking layer includes a light reflecting layer disposed on the thermopile membrane.

3. The thermopile device of claim 1, wherein the light blocking layer is disposed between the thermopile membrane and a package lid.

4. The thermopile device of claim 1, wherein the aperture includes an absorber layer.

5. A sensor package, comprising:
   a hermetic package; and
   a sensor device disposed within the hermetic package, the sensor device including a substrate including a support structure;
      a sensor disposed on the substrate and the support structure, the support structure configured to form a cavity between the sensor and the hermetic package; and
      a light blocking layer including a light reflecting layer disposed on the sensor, the light blocking layer including an aperture disposed proximate to an active portion of the sensor; and
   a package lid disposed on the hermetic package.

6. The sensor package in claim 5, wherein the sensor package includes a thermopile temperature sensor package having
   a thermopile device including
      a thermopile membrane disposed on the substrate;
      a thermopile disposed within the thermopile membrane, the thermopile including at least one thermocouple; and
      the light blocking layer including the light reflecting layer is disposed on the thermopile membrane and the aperture is disposed proximate to the thermopile.

7. The sensor package of claim 5, wherein the sensor includes an optical sensor.

8. The sensor package of claim 5, wherein the sensor includes a thermal sensor.

9. The sensor package of claim 5, wherein the sensor includes at least one of a microbolometer, a pyroelectric detector, or a carbon nanotube detector.

10. The sensor package of claim 5, wherein the package lid includes a metal layer configured to at least one of block or reflect light.

11. The sensor package of claim 10, wherein the metal layer includes an aperture configured to allow light.

12. The sensor package of claim 5, wherein the package lid includes a lens disposed in the package lid and configured to direct light to the sensor device.

13. The sensor package of claim 12, wherein the package lid includes a filter disposed on the lens.

14. The sensor package of claim 13, wherein the filter includes an infrared radiation filter.

15. The sensor package of claim 13, wherein the filter includes an anti-reflective filter.

16. The sensor package of claim 5, wherein the package lid is hermetically sealed to the hermetic package.

17. The thermopile device of claim 1, wherein the support structure comprises a pedestal.

* * * * *